(12) United States Patent
Selsley (10) Patent No.: US 6,316,353 B1
(45) Date of Patent: Nov. 13, 2001

(54) METHOD OF FORMING CONDUCTIVE CONNECTIONS

(75) Inventor: Adam D. Selsley, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/252,427

(22) Filed: Feb. 18, 1999

(51) Int. Cl.$^7$ ............................................. H01L 21/4763
(52) U.S. Cl. ..................... 438/643; 438/597; 438/648; 438/653; 438/656
(58) Field of Search ................... 438/597, 618, 438/622, 625, 642, 643, 644, 648, 652, 653, 654, 655, 656

(56) References Cited

U.S. PATENT DOCUMENTS

| | | | |
|---|---|---|---|
| 5,776,831 | * 7/1998 | Padmanabhan et al. | 438/653 |
| 5,858,184 | * 1/1999 | Fu et al. | 204/192 |
| 5,874,353 | * 2/1999 | Lin et al. | 438/592 |
| 5,975,912 | * 11/1999 | Hillman et al. | 438/680 |
| 5,985,759 | * 11/1999 | Kim et al. | 438/653 |
| 6,171,717 | * 1/2001 | Chang et al. | 428/698 |

* cited by examiner

Primary Examiner—Carl Whitehead, Jr.
Assistant Examiner—Jeff Vockrodt
(74) Attorney, Agent, or Firm—Wells, St. John, Roberts, Gregory & Matkin, P.S.

(57) ABSTRACT

A method of forming a conductive connection between a first region and a second region includes forming a first titanium comprising layer over and in electrical connection with the first region. The first layer is exposed to a nitrogen containing plasma effective to transform at least an outer portion thereof into a second layer comprising titanium nitride. An elemental titanium comprising third layer is formed over the second layer. The third layer is exposed to a nitrogen containing plasma effective to transform at least an outer portion thereof into a layer comprising titanium nitride. The second region is formed over and in electrical connection with the transformed third layer. A method of forming a conductive line includes a conductively doped silicon comprising semiconductive material being formed. Titanium is deposited over the semiconductive material to form a first layer in electrical connection with the semiconductive material. The first layer is exposed to a nitrogen containing plasma effective to transform at least an outer portion thereof into a second layer comprising titanium nitride. Titanium is deposited to form an elemental titanium comprising third layer over the second layer. The third layer is exposed to a nitrogen containing plasma effective to transform at least an outer portion thereof into a layer comprising titanium nitride. A metal is deposited in electrical connection with the transformed third layer. The semiconductive first layer, second layer, third layer, transformed third layer and metal materials are formed into a conductive line.

48 Claims, 7 Drawing Sheets

METHOD OF FORMING CONDUCTIVE CONNECTIONS

TECHNICAL FIELD

This invention relates to methods of forming a conductive connection on a substrate between a first region and a second region, to methods of forming a conductive interface to be received between a first region and a second region, to methods of forming a conductive contact, and to methods of forming a conductive line.

BACKGROUND OF THE INVENTION

In the processing of integrated circuits, electrical contact is typically made to isolated active device regions formed within a wafer substrate typically comprising monocrystalline silicon. The active device regions are connected by high electrically conductive paths or lines which are fabricated above insulative material which covers the substrate surface. To provide electrical connection between the conductive paths, and active-device regions, an opening in the insulative material is typically provided to enable conductive films to make electrical connection with desired regions. Such openings are typically referred to as contact openings, or simply "contacts".

As transistor-active area dimensions approached one micron in diameter, conventional process parameters resulted in intolerable increased resistance between the active region or area and the conductive layer. One way of reducing such contact resistance is by formation of a metal silicide atop the active area prior to application of conductive material which will partially or fully fill the remaining contact opening and/or other material which will be utilized to form the conductive runner. One common metal silicide material formed is $TiSi_x$, where "x" is predominantly "2".

Ultimately, an electrically conductive contact-filling material, such as tungsten, would be provided for making electrical connection to the contact with the active area. However, tungsten adheres poorly to titanium silicide. Additionally, it is desirable to prevent intermixing of the contact-filling material with the silicide and underlying silicon. Accordingly, an intervening layer is typically provided to prevent diffusion of the silicon and silicide with the plug-filling metal, and to effectively adhere the plug-filling metal to the underlying substrate. Such material is, accordingly, also electrically conductive and commonly referred to as a "barrier layer" due to its anti-diffusion properties. One material of choice for use as a glue/diffusion barrier layer is titanium nitride. This is an attractive material as a contact diffusion barrier in silicon integrated circuits because it behaves as an impermeable barrier to silicon, and because the activation energy for diffusion of other impurities is very high. Titanium nitride is also chemically thermodynamically very stable, and it has low electrical resistance.

Titanium silicide and titanium nitride can be formed in a number of different manners. One prior art process for forming titanium silicide and titanium nitride barrier contacts comprises first depositing an elemental titanium layer by physical vapor deposition (i.e., sputtering) to within a contact opening over a silicon containing region. Subsequently, the wafer is moved from the physical vapor deposition chamber to a chemical vapor deposition chamber. There, titanium nitride is chemical vapor deposited from an organic titanium containing precursor, such as tetrakisdimethylamido titanium (TDMAT). The wafer is subsequently exposed to suitable annealing conditions to transform titanium at the base of the contact into a titanium silicide. Tungsten or some other conductive material (for example, conductively doped semiconductor materials) is then deposited to fill the remaining contact opening. A planarizing process, such as chemical-mechanical polishing, is then utilized to isolate the conductive plug-filling material within the contact opening.

In another process, titanium is chemical vapor deposited utilizing $TiCl_4$ and $H_2$ as precursors at sub-atmospheric pressure, at a temperature of around 635° C., and in the presence of plasma. Deposition under these conditions, principally because of the temperature, will cause the titanium which deposits immediately over the silicon-containing active region to constitute titanium silicide. The titanium overlying insulative material will deposit as elemental titanium. The wafer is then moved from the $TiCl_4$ deposition chamber to an organic chemical vapor deposition chamber where the above-described TDMAT is utilized to deposit a TiN layer. The processing then continues as otherwise described above.

This invention was principally motivated in addressing problems associated with contact plug formation involving titanium silicide and titanium nitride interface materials between a silicon-containing region and an overlying conductive plug-filling material, such as tungsten. The artisan will, however, appreciate applicability of the invention to any other aspect of semiconductor wafer processing whereby a conductive connection is formed on a substrate between a first region comprising silicon and some second region, with the invention only being limited by the accompanying claims appropriately interpreted in accordance with the Doctrine of Equivalents.

SUMMARY OF INVENTION

The invention comprises methods of forming a conductive connection on a substrate between a first region and a second region, methods of forming a conductive interface to be received between a first region and a second region, methods of forming a conductive contact, and methods of forming a conductive line.

In one aspect, a method of forming a conductive connection on a substrate between a first region and a second region, includes forming a first titanium comprising layer over and in electrical connection with the first region. The first layer is exposed to a nitrogen containing plasma effective to transform at least an outer portion of the first layer into a second layer comprising titanium nitride. Titanium is deposited to form an elemental titanium comprising third layer over the second layer. The third layer is exposed to a nitrogen containing plasma effective to transform at least an outer portion of the third layer into a layer comprising titanium nitride. The second region is formed over and in electrical connection with the transformed third layer.

In one aspect, the invention comprises a method of forming a conductive line. A conductively doped silicon comprising semiconductive material is formed over a substrate. Titanium is deposited over the semiconductive material to form a first layer in electrical connection with the semiconductive material. The first layer is exposed to a nitrogen containing plasma effective to transform at least an outer portion of the first layer into a second layer comprising titanium nitride. Titanium is deposited to form an elemental titanium comprising third layer over the second layer. The third layer is exposed to a nitrogen containing plasma effective to transform at least an outer portion of the third layer into a layer comprising titanium nitride. A metal is deposited over and in electrical connection with the transformed third layer. The semiconductive first layer, second layer, third layer, transformed third layer and metal materials are formed into a conductive line.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One method of forming a conductive connection on a substrate between a first region comprising silicon and a second region is described with reference to FIGS. 1–8, and another is described with reference to FIGS. 9–14. The exemplary implementation of FIGS. 1–8 forms a conductive contact. The exemplary implementation with respect to FIGS. 9–14 forms a conductive line. Any other conductive connections on a substrate between a first region comprising silicon and a second region are contemplated.

Figure 1:
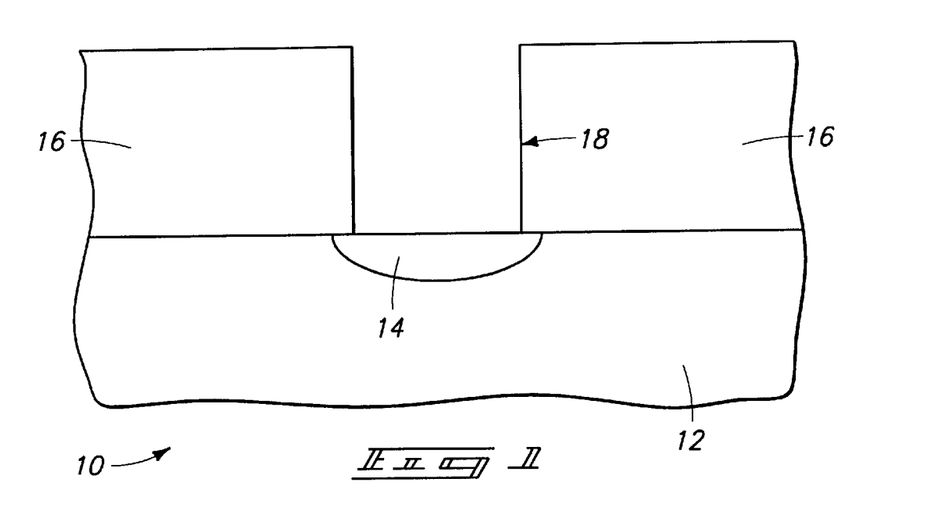
FIG. 1 is a diagrammatic sectional view of a semiconductor wafer fragment at one processing step in accordance with the invention.

Referring initially to FIG. 1, a semiconductor wafer fragment in process is indicated generally with reference numeral 10. Such comprises a bulk monocrystalline silicon substrate 12 having a diffusion region 14 formed therein. Alternate silicon comprising substrates from monocrystalline silicon are, of course, contemplated. By way of example only, polycrystalline or monocrystalline comprising layers, plugs and devices are exemplary possible silicon comprising substrates. Region 14 in this example can be considered as a first region comprising silicon to which electrical connection is to be made. An insulative material 16, such as doped or undoped silicon dioxide, is formed over silicon comprising substrate 12. A contact opening 18 is formed within insulative material 16 to extend to at least proximate region 14, and preferably all the way to outwardly expose region 14 as shown. Region 14 may or may not include a native oxide formed thereover.

Figure 2:
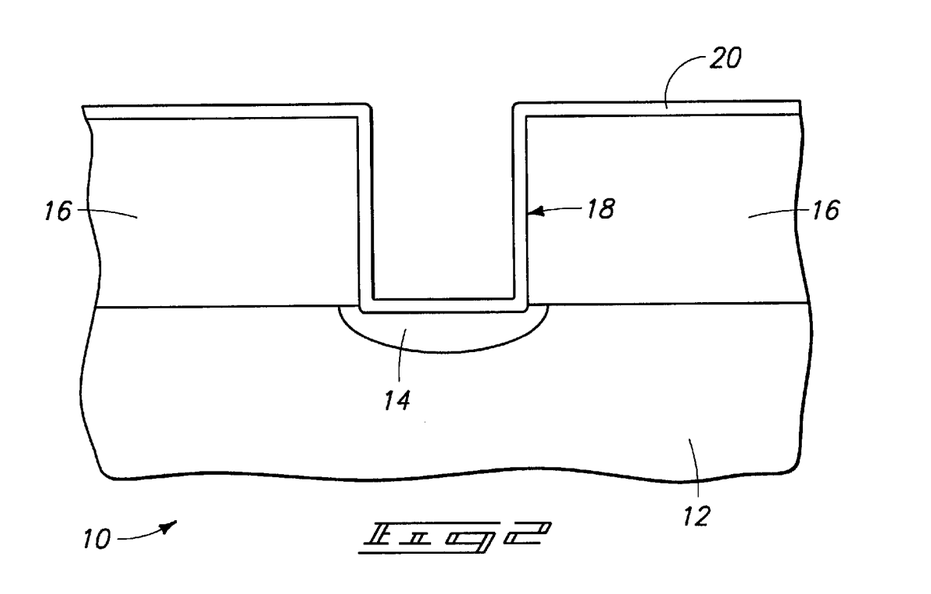
FIG. 2 is a view of the FIG. 1 wafer at a processing step after that depicted by FIG. 1.

Referring to FIG. 2, titanium is deposited over insulative material 16 to within contact opening 18, and accordingly over first region 14, to form a first layer 20 in electrical connection with first region 14. An example and preferred process for depositing layer 20 comprises chemical vapor deposition in a suitable chamber, for example a plasma-enhanced chemical vapor deposition chamber, preferably using an inorganic titanium containing precursor. Preferably, the depositing to form first layer 20 is at a temperature effective to form titanium silicide during the first layer depositing from silicon of first region 14 and the titanium being deposited thereover. Alternately but less preferred, the layer could be deposited as substantially elemental titanium, with subsequent suitable high temperature processing forming titanium silicide after the deposition. Where the preferred silicide is ultimately formed, all of the titanium of first layer 20 immediately over first region 14 might constitute titanium silicide (shown), or only an inner portion thereof comprising silicide with an outer portion thereof comprising elemental titanium (not shown). An example preferred process for forming layer 20 is to combine $TiCl_4$ and $H_2$ in a capacitively coupled plasma-enhanced chemical vapor deposition chamber powered at 700 watts, a wafer chuck temperature of 635° C., and a pressure of 4 Torr. Such deposited titanium at a rate of 2.5 Angstroms per second, with a titanium silicide layer being produced at such temperature. Alternately by way of example only but less preferred, layer 20 can be formed as titanium silicide by chemical vapor deposition using titanium and silicon containing precursors. A 4 preferred thickness for layer 20 over region 14 is from 100 Angstroms to 250 Angstroms.

Figure 3:
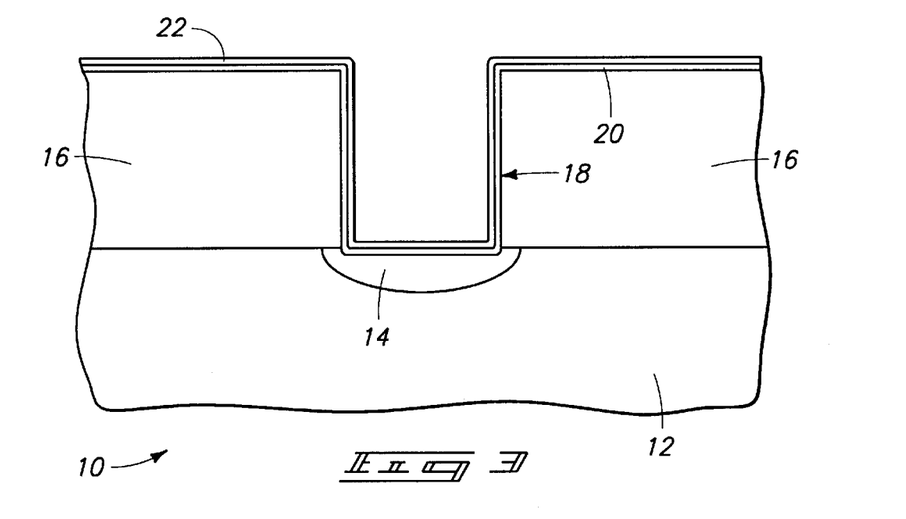
FIG. 3 is a view of the FIG. 1 wafer at a processing step after that depicted by FIG. 2.

Referring to FIG. 3, first layer 20 has been exposed to a nitrogen containing plasma effective to transform at least an outer portion (only an outer portion as shown) of first layer 20 into a second layer 22 comprising titanium nitride. Such processing most preferably occurs in the same chamber within which layer 20 was initially formed. Layer 22 is preferably formed to a thickness of from about 5 Angstroms to about 50 Angstroms. Such exposing preferably includes both nitrogen and hydrogen components in the plasma. Examples include $NH_3$, or $N_2$ and $H_2$. A preferred example is plasma power at from 100 to 750 watts, wafer chuck temperature maintained at from 600° C. to 680° C., and reactor pressure being maintained from 500 mTorr to 400 Torr. A specific example is 200 watts, 635° C., and 1 Torr. $N_2$ and $H_2$ flow to the reactor is preferably such that the flow of $H_2$ exceeds that of $N_2$. A specific example under the above conditions includes an $H_2$ flow of 600 sccm in a $N_2$ flow of 400 sccm. Accordingly if first layer 20 comprises an outer elemental titanium portion, at least an outer portion thereof will be transformed to titanium nitride during such exposing. Alternately where first layer comprises an outer titanium silicide portion, an outermost portion thereof would be transformed to titanium nitride during the above exposing.

Figure 4:
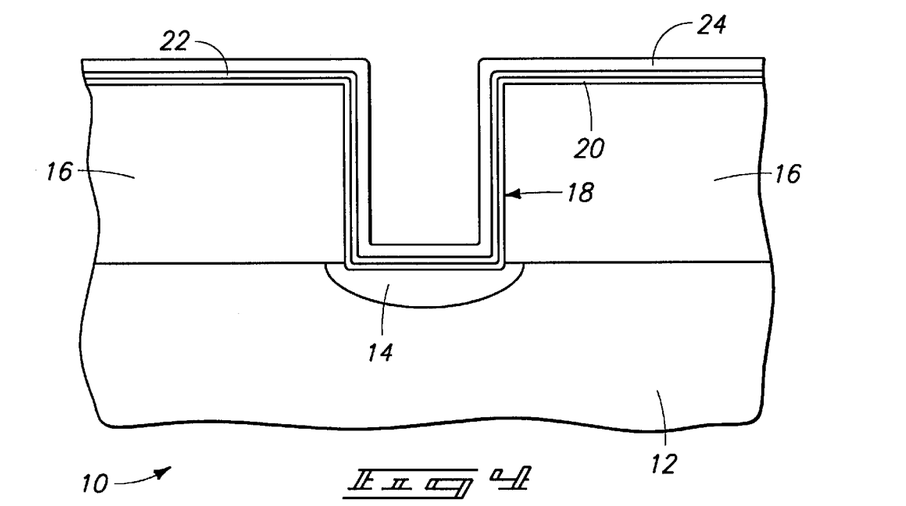
FIG. 4 is a view of the FIG. 1 wafer at a processing step after that depicted by FIG. 3.

Referring to FIG. 4, titanium is deposited to form an elemental titanium comprising third layer 24 over second layer 22. Again, the preferred deposition is chemical vapor deposition utilizing the same chamber within which the first deposition and plasma exposure occurred. Further, formation of layer 24 also preferably occurs under plasma conditions. Preferred and exemplary processing is as described above with respect to deposited first layer 20. Intervening titanium nitride comprising layer 22 over silicide comprising layer 20 immediately over region 14 advantageously prevents deposited layer 24 from being transformed during or after deposition to a silicide. A preferred thickness for layer 24 is from 100 Angstroms to 150 Angstroms.

Figure 5:
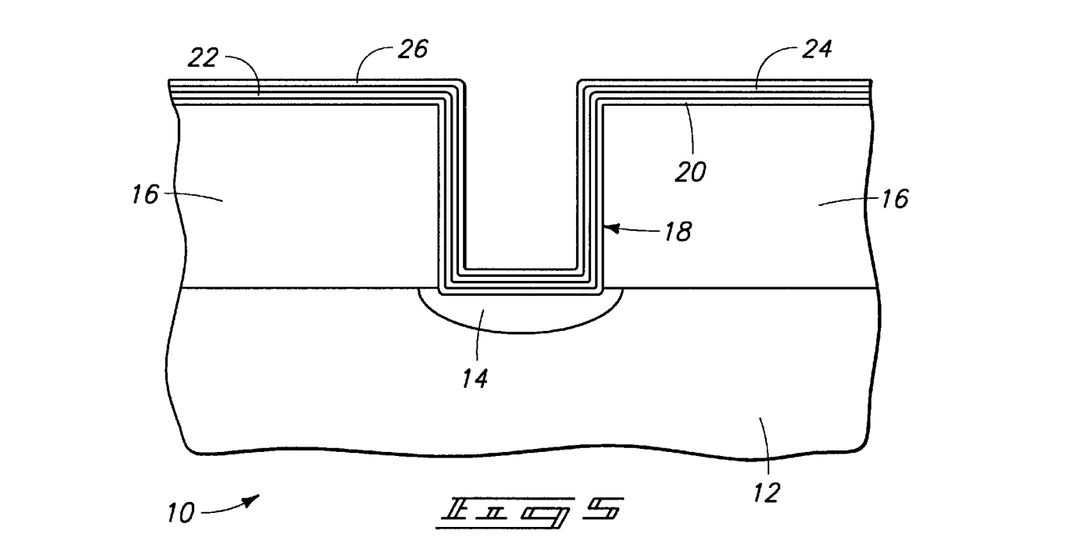
FIG. 5 is a view of the FIG. 1 wafer at a processing step after that depicted by FIG. 4.

Referring to FIG. 5, third layer 24 is exposed to a nitrogen containing plasma effective to transform at least an outer portion (only an outer portion as shown) of third layer 24 into a layer 26 comprising titanium nitride. Again, such exposing most preferably occurs in the same chamber which the first exposing and depositions occurred. Further, substrate 10 is preferably not removed from such chamber from start of the first layer 20 depositing until after the exposing to transform at least the outer portion of third layer 24 into titanium nitride comprising layer 26. A preferred thickness for layer 26 is from about 100 Angstroms to about 200 Angstroms. A further preferred embodiment results in complete transformation of titanium layer 24 into a titanium nitride comprising layer (not shown). Preferably, the exposing of layer 26 is similar to the nitrogen plasma exposing of layer 20, as described above. Preferably, a greater quantity of nitrogen is present in the exposing of third layer 24 than in the exposing of first layer 20. Further, where $N_2$ and $H_2$ are utilized, there is preferably a greater quantity of $H_2$ than $N_2$ in the exposing of the first layer, and a greater quantity of $N_2$ than $H_2$ in the exposing of the third layer. A specific example is such as that described above, with differing $N_2$ and $H_2$ flows of 600 sccm and 400 sccm, respectively.

After the exposing of third layer 24 to a nitrogen plasma to transform at least an outer portion thereof into a titanium nitride comprising layer, such transformed outer portion is preferably exposed to a nitrogen containing atmosphere at a pressure of at least 50 Torr before any subsequent deposition. Such atmosphere is preferably void of plasma and the exposure conducted before removing the substrate from the chamber within which the nitrogen plasma exposure occurred. A preferred processing step here is at 60 Torr in a 100% $N_2$ or $NH_3$ atmosphere at 635° C. for about 35 seconds. Such has been discovered to further reduce contact resistant.

Figure 6:
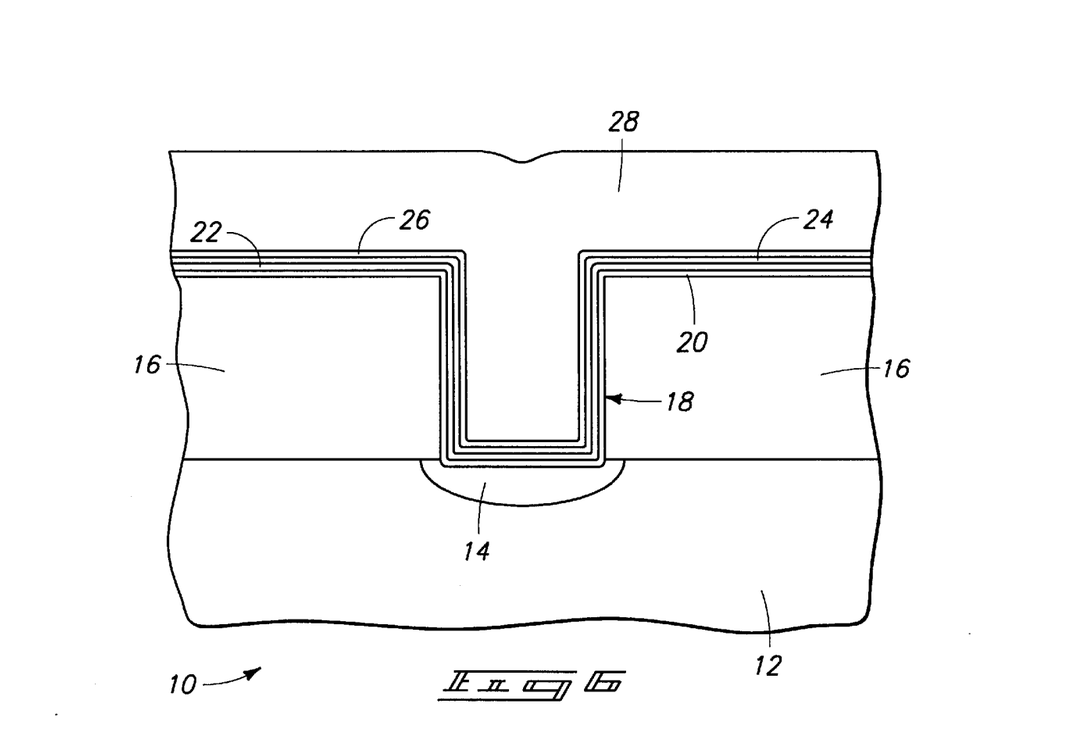
FIG. 6 is a view of the FIG. 1 wafer at a processing step after that depicted by FIG. 5.

Referring to FIG. 6, a conductive material or layer 28, such as for example elemental tungsten or conductive poly, is deposited over insulative material 16 to within contact opening 18 over transformed layer 26. Such comprises or constitutes an exemplary second region, whereby an interface or electrical connection is being made between a second region 28 and a first region 14.

Figure 7:
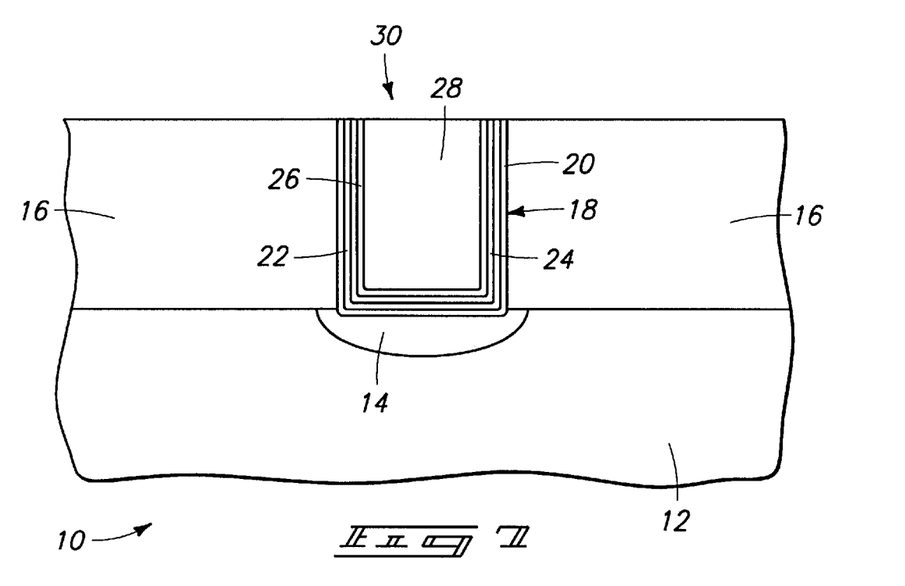
FIG. 7 is a view of the FIG. 1 wafer at a processing step after that depicted by FIG. 6.

Referring to FIG. 7, remaining first layer, second layer, third layer, transformed third layer, and metal materials are removed from over insulative material 16 to form an insulative conductive contact or contact plug 30 within contact opening 18 in electrical connection with silicon comprising substrate 12. An example and preferred processing is chemical-mechanical polishing.

The above is but one example of a method of forming a conductive connection on a substrate between a first region and a second region. But one other example of such a method whereby such occurs in the formation of a conductive line is next described with reference to FIGS. 8–14. Like numerals from the first described embodiment have been utilized where appropriate for analogous layers, with differences being indicated with different numerals.

Figure 8:
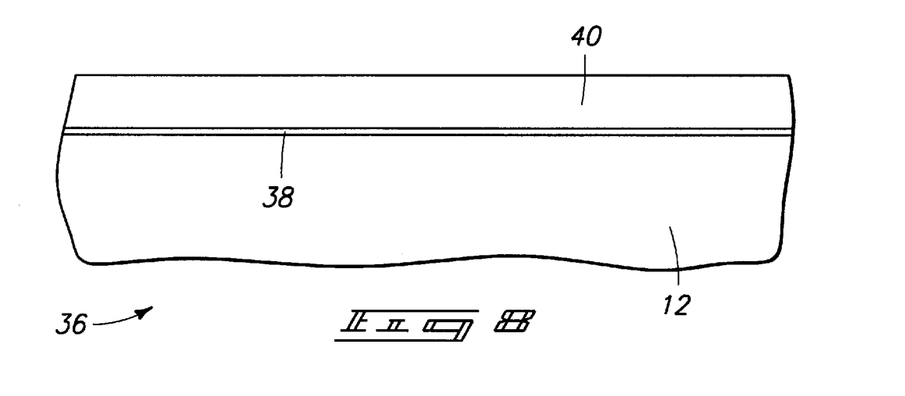
FIG. 8 is a diagrammatic sectional view of an alternate embodiment semiconductor wafer fragment at one processing step in accordance with the invention.

FIG. 8 indicates a semiconductor wafer fragment 36 comprising a bulk monocrystalline silicon substrate 12. Exemplary fabrication is described with reference to formation of a transistor gate. A gate oxide layer 38 is formed over substrate 12. A conductively doped semiconductive material layer 40 is formed over layer 38.

Figure 9:
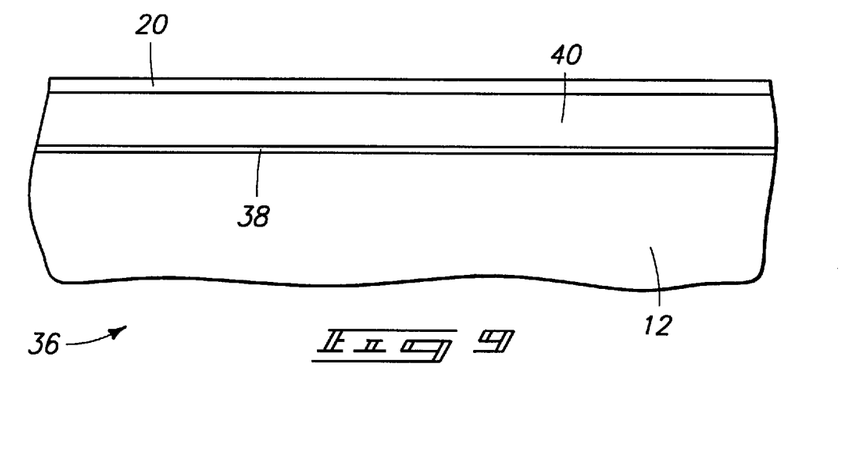
FIG. 9 is a view of the FIG. 8 wafer at a processing step after that depicted by FIG. 8.

Referring to FIG. 9, titanium is deposited over semiconductive material 40 to form a first layer 20 in electrical connection with semiconductive material 40. Material and processing is preferably the same as described above for layer 20 with respect to the first described embodiment. Alternately by way of example only but less preferred, layer 20 can be formed as titanium silicide by chemical vapor deposition using titanium and silicon containing precursors.

Figure 10:
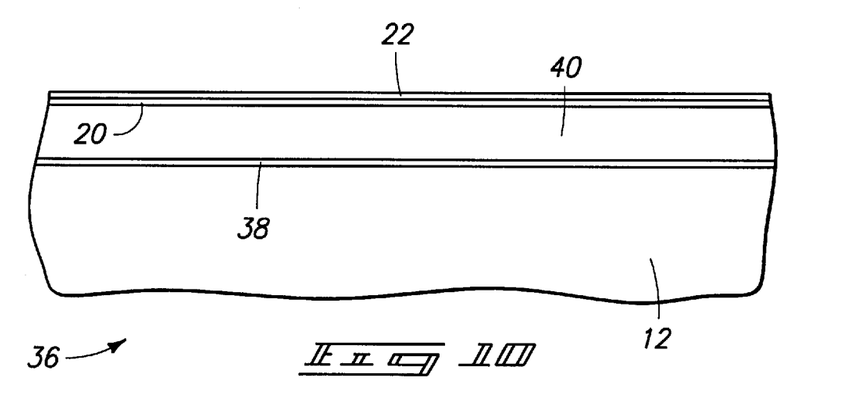
FIG. 10 is a view of the FIG. 8 wafer at a processing step after that depicted by FIG. 9.

Referring to FIG. 10, first layer 20 is exposed to a nitrogen containing plasma effective to transform at least an outer portion thereof into a second layer 22 comprising titanium nitride. Example materials and processing are again as described above with respect to formation of layer 22 in the first-described embodiment.

Figure 11:
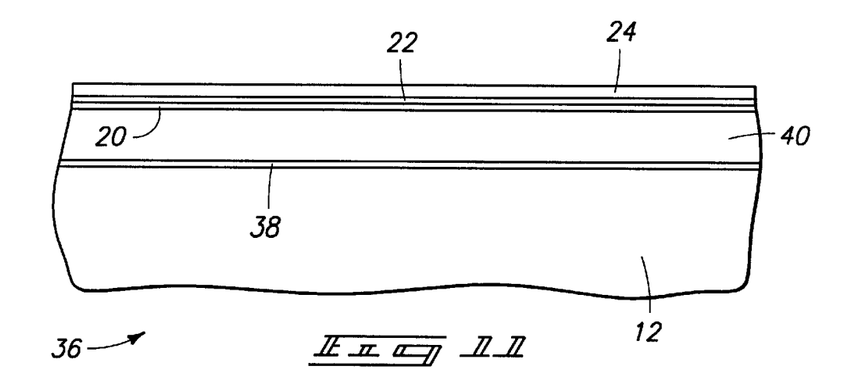
FIG. 11 is a view of the FIG. 8 wafer at a processing step after that depicted by FIG. 10.

Referring to FIG. 11, titanium is deposited to form an elemental titanium comprising third layer 24 over second layer 22. Processing is again preferably as described above with respect to the first embodiment relative to forming layer 24.

Figure 12:
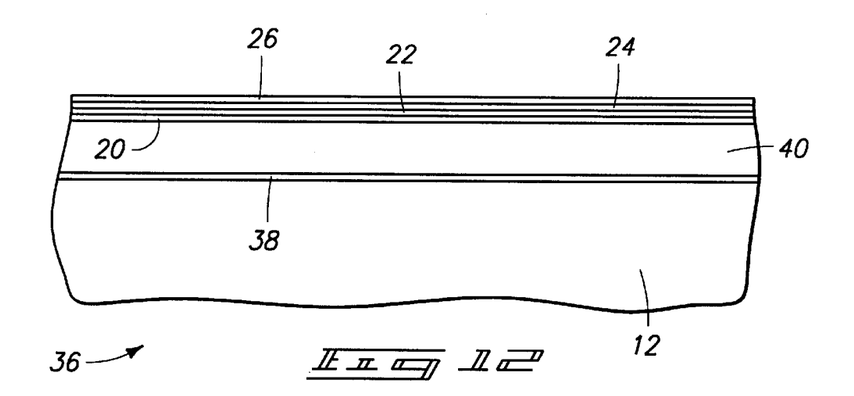
FIG. 12 is a view of the FIG. 8 wafer at a processing step after that depicted by FIG. 11

Referring to FIG. 12, third layer 24 is exposed to a nitrogen containing plasma effective to transform at least an outer portion thereof into a layer 26 comprising titanium nitride. Processing and materials are again preferably as described above with respect to layer 26 in the first described embodiment.

Figure 13:
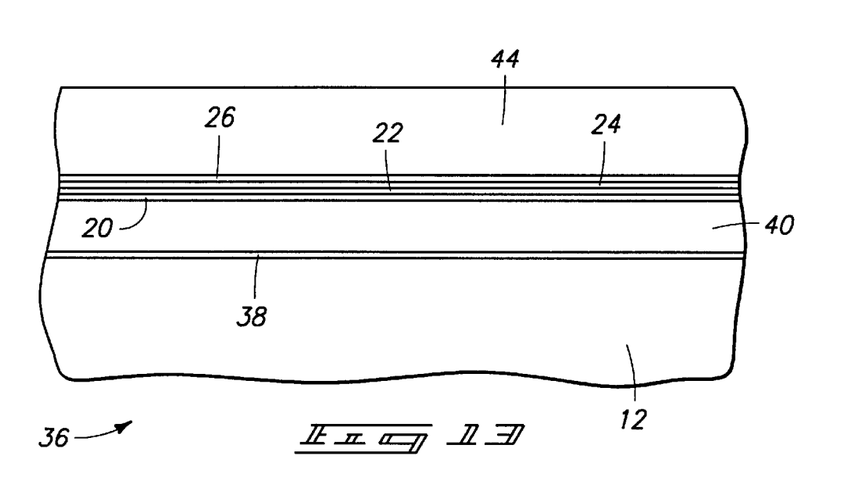
FIG. 13 is a view of the FIG. 8 wafer at a processing step after that depicted by FIG. 12.

Referring to FIG. 13, a metal layer 44, for example elemental tungsten, is deposited over and in electrical connection with layer 26.

Figure 14:
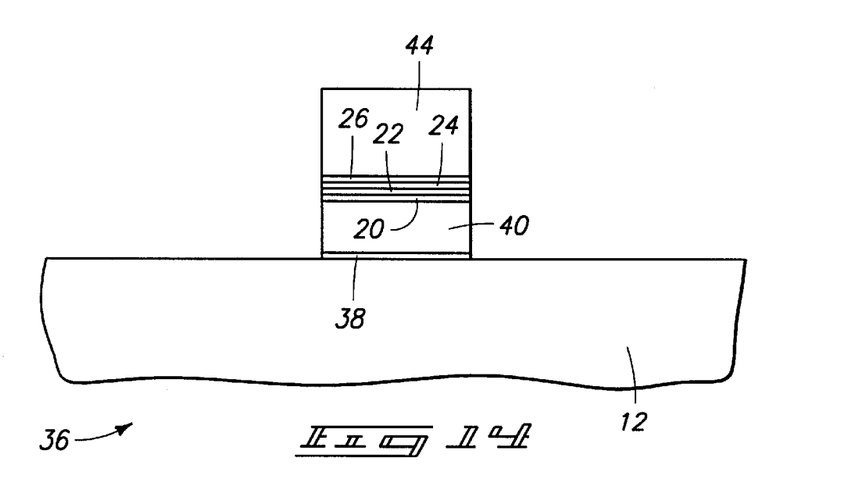
FIG. 14 is a view of the FIG. 8 wafer at a processing step after that depicted by FIG. 13.

Referring to FIG. 14, the semiconductive first layer, second layer, third layer, transformed outer portion of the third layer, and metal materials are formed into a conductive line. Such forming most preferably comprises etching all of said layers using a common masking step at the conclusion of formation of all such layers, as shown.

Preferably, all such depositings and exposings occur in the same plasma-enhanced chemical vapor deposition chamber.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive connection on a substrate between a first region comprising silicon and a second region, comprising:

depositing titanium over the first region to form a first layer in electrical connection with the first region;

exposing the first layer to a nitrogen containing plasma effective to transform at least an outer portion of the first layer into a second layer comprising titanium nitride;

depositing titanium to form an elemental titanium comprising third layer over the second layer;

exposing the third layer to a nitrogen containing plasma effective to transform at least an outer portion of the third layer into a layer comprising titanium nitride;

forming the second region over and in electrical connection with the transformed third layer; and wherein the depositing to form the first layer is at a temperature effective to form titanium silicide during said first layer depositing from silicon of the first region and the titanium being deposited over the first region.

2. The method of claim 1 wherein the first layer depositing forms all of the titanium of the first layer immediately over the first region to constitute titanium silicide.

3. The method of claim 1 wherein the first layer depositing forms only an inner portion of the titanium of the first layer immediately over the first region to constitute titanium silicide.

4. The method of claim 1 further comprising, after the exposing of the third layer, exposing the transformed outer portion of the third layer to a nitrogen containing atmosphere at a pressure of at least 50 Torr prior to any subsequent deposition.

5. A method of forming a conductive connection on a substrate between a first region comprising silicon and a second region, comprising:

depositing titanium over the first region to form a first layer in electrical connection with the first region;

exposing the first layer to a nitrogen containing plasma effective to transform at least an outer portion of the first layer into a second layer comprising titanium nitride;

depositing titanium to form an elemental titanium comprising third layer over the second layer;

exposing the third layer to a nitrogen containing plasma effective to transform at least an outer portion of the third layer into a layer comprising titanium nitride;

forming the second region over and in electrical connection with the transformed third layer; and wherein the exposings each include both $N_2$ plasma and $H_2$ plasma.

6. The method of claim 5 comprising a greater quantity of $N_2$ in the exposing of the third layer than in the exposing of the first layer.

7. The method of claim 5 comprising a greater quantity of $H_2$ than $N_2$ in the exposing of the first layer and a greater quantity of $N_2$ than $H_2$ in the exposing of the third layer.

8. The method of claim 5 further comprising, after the exposing of the third layer, exposing the transformed outer portion of the third layer to a nitrogen containing atmosphere at a pressure of at least 50 Torr prior to any subsequent deposition.

9. A method of forming a conductive connection on a substrate between a first region comprising silicon and a second region, comprising:

depositing titanium over the first region to form a first layer in electrical connection with the first region;

exposing the first layer to a nitrogen containing plasma effective to transform at least an outer portion of the first layer into a second layer comprising titanium nitride;

depositing titanium to form an elemental titanium comprising third layer over the second layer;

exposing the third layer to a nitrogen containing plasma effective to transform at least an outer portion of the third layer into a layer comprising titanium nitride;

forming the second region over and in electrical connection with the transformed third layer; and further comprising, after the exposing of the third layer, exposing the transformed outer portion of the third layer to a nitrogen containing atmosphere at a pressure of at least 50 Torr prior to any subsequent deposition.

10. A method of forming a conductive connection on a substrate between a first region and a second region, comprising:

forming a first titanium comprising layer over and in electrical connection with the first region;

exposing the first layer to a nitrogen containing plasma effective to transform at least an outer portion of the first layer into a second layer comprising titanium nitride;

depositing titanium to form an elemental titanium comprising third layer over the second layer;

exposing the third layer to a nitrogen containing plasma effective to transform at least an outer portion of the third layer into a layer comprising titanium nitride;

forming the second region over and in electrical connection with the transformed third layer; and wherein the forming of the first titanium comprising layer comprises chemical vapor deposition of titanium silicide.

11. The method of claim 10 further comprising, after the exposing of the third layer, exposing the transformed outer portion of the third layer to a nitrogen containing atmosphere at a pressure of at least 50 Torr prior to any subsequent deposition.

12. A method of forming a conductive interface to be received between a first region comprising silicon and a second region, comprising:

in a chemical vapor deposition chamber, chemical vapor depositing titanium over the first region to form a first layer comprising titanium silicide formed from silicon of the first region and the deposited titanium;

in said chamber, exposing the first layer to a nitrogen containing plasma effective to transform at least an outer portion of the first layer into a second layer comprising titanium nitride;

in said chamber, chemical vapor depositing titanium to form an elemental titanium comprising third layer over the second layer; and in said chamber, exposing the third layer to a nitrogen containing plasma effective to transform at least an outer portion of the third layer into a layer comprising titanium nitride.

13. The method of claim 12 wherein the first layer is formed to a thickness from about 100 Angstroms to about 250 Angstroms, the second layer is formed to a thickness of from about 5 Angstroms to about 50 Angstroms and the third layer is formed to a thickness from about 100 Angstroms to about 200 Angstroms.

14. The method of claim 12 wherein the depositings are plasma enhanced.

15. The method of claim 12 wherein the first layer comprises an outer elemental titanium portion which is transformed to titanium nitride during the exposing of the first layer.

16. The method of claim 12 wherein the first layer comprises an outer titanium silicide portion which is transformed to titanium nitride during the exposing of the first layer.

17. The method of claim 12 wherein the depositings and the exposings occur in said chamber with the substrate not being removed therefrom from start of the first layer depositing until after the exposing to transform at least the outer portion of the third layer.

18. The method of claim 12 wherein said depositings are by chemical vapor deposition using an inorganic titanium containing precursor.

19. The method of claim 12 further comprising, after the exposing of the third layer, exposing the transformed outer portion of the third layer to a nitrogen containing atmosphere at a pressure of at least 50 Torr prior to any subsequent deposition.

20. A method of forming a conductive interface to be received between a first region and a second region, comprising:
   in a chemical vapor deposition chamber, chemical vapor depositing titanium silicide over and in electrical connection with the first region;
   in said chamber, exposing the first layer to a nitrogen containing plasma effective to transform at least an outer portion of the first layer into a second layer comprising titanium nitride;
   in said chamber, chemical vapor depositing titanium to form an elemental titanium comprising third layer over the second layer; and
   in said chamber, exposing the third layer to a nitrogen containing plasma effective to transform at least an outer portion of the third layer into a layer comprising titanium nitride.

21. The method of claim 20 further comprising, after the exposing of the third layer, exposing the transformed outer portion of the third layer to a nitrogen containing atmosphere at a pressure of at least 50 Torr prior to any subsequent deposition.

22. A method of forming a conductive contact comprising:
   forming an insulative material over a silicon comprising substrate;
   forming a contact opening within the insulative material to proximate the silicon comprising substrate;
   depositing titanium over the insulative material to within the contact opening to form a first layer comprising titanium silicide in electrical connection with the silicon comprising substrate;
   exposing the first layer to a nitrogen containing plasma effective to transform at least an outer portion of the first layer into a second layer comprising titanium nitride;
   depositing titanium over the insulative material to within the contact opening to form an elemental titanium comprising third layer over the second layer;
   exposing the third layer to a nitrogen containing plasma effective to transform at least an outer portion of the third layer into a layer comprising titanium nitride;
   depositing a metal over the insulative material to within the contact opening over the transformed third layer;
   removing any remnant first layer, second layer, third layer, transformed third layer and metal materials from over the insulative material to form an isolated conductive contact within the contact opening in electrical connection with the silicon comprising substrate; and
   wherein said depositings are by chemical vapor deposition using an inorganic titanium containing precursor.

23. The method of claim 22 further comprising, after the exposing of the third layer, exposing the transformed outer portion of the third layer to a nitrogen containing atmosphere at a pressure of at least 50 Torr prior to any subsequent deposition.

24. A method of forming a conductive contact comprising:
   forming an insulative material over a silicon comprising substrate;
   forming a contact opening within the insulative material to proximate the silicon comprising substrate;
   depositing titanium over the insulative material to within the contact opening to form a first layer comprising titanium silicide in electrical connection with the silicon comprising substrate;
   exposing the first layer to a nitrogen containing plasma effective to transform at least an outer portion of the first layer into a second layer comprising titanium nitride;
   depositing titanium over the insulative material to within the contact opening to form an elemental titanium comprising third layer over the second layer;
   exposing the third layer to a nitrogen containing plasma effective to transform at least an outer portion of the third layer into a layer comprising titanium nitride;
   depositing a metal over the insulative material to within the contact opening over the transformed third layer;
   removing any remnant first layer, second layer, third layer, transformed third layer and metal materials from over the insulative material to form an isolated conductive contact within the contact opening in electrical connection with the silicon comprising substrate; and
   wherein the first layer depositing forms all of the titanium of the first layer immediately over the silicon comprising substrate to constitute titanium silicide.

25. The method of claim 24 further comprising, after the exposing of the third layer, exposing the transformed outer portion of the third layer to a nitrogen containing atmosphere at a pressure of at least 50 Torr prior to any subsequent deposition.

26. A method of forming a conductive contact comprising:
   forming an insulative material over a silicon comprising substrate;
   forming a contact opening within the insulative material to proximate the silicon comprising substrate;
   depositing titanium over the insulative material to within the contact opening to form a first layer comprising titanium silicide in electrical connection with the silicon comprising substrate;
   exposing the first layer to a nitrogen containing plasma effective to transform at least an outer portion of the first layer into a second layer comprising titanium nitride;
   depositing titanium over the insulative material to within the contact opening to form an elemental titanium comprising third layer over the second layer;
   exposing the third layer to a nitrogen containing plasma effective to transform at least an outer portion of the third layer into a layer comprising titanium nitride;
   depositing a metal over the insulative material to within the contact opening over the transformed third layer;
   removing any remnant first layer, second layer, third layer, transformed third layer and metal materials from over the insulative material to form an isolated conductive contact within the contact opening in electrical connection with the silicon comprising substrate; and
   wherein the first layer depositing forms only an inner portion of the titanium of the first layer immediately over the silicon comprising substrate to constitute titanium silicide.

27. The method of claim 26 further comprising, after the exposing of the third layer, exposing the transformed outer portion of the third layer to a nitrogen containing atmosphere at a pressure of at least 50 Torr prior to any subsequent deposition.

28. A method of forming a conductive contact comprising:
   forming an insulative material over a silicon comprising substrate;
   forming a contact opening within the insulative material to proximate the silicon comprising substrate;
   depositing titanium over the insulative material to within the contact opening to form a first layer comprising titanium silicide in electrical connection with the silicon comprising substrate;
   exposing the first layer to a nitrogen containing plasma effective to transform at least an outer portion of the first layer into a second layer comprising titanium nitride;
   depositing titanium over the insulative material to within the contact opening to form an elemental titanium comprising third layer over the second layer;
   exposing the third layer to a nitrogen containing plasma effective to transform at least an outer portion of the third layer into a layer comprising titanium nitride;
   depositing a metal over the insulative material to within the contact opening over the transformed third layer;
   removing any remnant first layer, second layer, third layer, transformed third layer and metal materials from over the insulative material to form an isolated conductive contact within the contact opening in electrical connection with the silicon comprising substrate; and
   wherein the depositings occur in the same chamber.

29. The method of claim 28 further comprising, after the exposing of the third layer, exposing the transformed outer portion of the third layer to a nitrogen containing atmosphere at a pressure of at least 50 Torr prior to any subsequent deposition.

30. A method of forming a conductive contact comprising:
   forming an insulative material over a silicon comprising substrate;
   forming a contact opening within the insulative material to proximate the silicon comprising substrate;
   depositing titanium over the insulative material to within the contact opening to form a first layer comprising titanium silicide in electrical connection with the silicon comprising substrate;
   exposing the first layer to a nitrogen containing plasma effective to transform at least an outer portion of the first layer into a second layer comprising titanium nitride;
   depositing titanium over the insulative material to within the contact opening to form an elemental titanium comprising third layer over the second layer;
   exposing the third layer to a nitrogen containing plasma effective to transform at least an outer portion of the third layer into a layer comprising titanium nitride;
   depositing a metal over the insulative material to within the contact opening over the transformed third layer;
   removing any remnant first layer, second layer, third layer, transformed third layer and metal materials from over the insulative material to form an isolated conductive contact within the contact opening in electrical connection with the silicon comprising substrate; and
   wherein the exposings occur in the same chamber.

31. The method of claim 30 wherein the depositings and the exposings occur in the same chamber.

32. The method of claim 30 wherein the depositings and the exposings occur in the same chamber with the substrate not being removed therefrom from start of the first layer depositing until after the exposing to transform at least the outer portion of the third layer.

33. The method of claim 30 further comprising, after the exposing of the third layer, exposing the transformed outer portion of the third layer to a nitrogen containing atmosphere at a pressure of at least 50 Torr prior to any subsequent deposition.

34. A method of forming a conductive contact comprising:
   forming an insulative material over a silicon comprising substrate;
   forming a contact opening within the insulative material to proximate the silicon comprising substrate;
   depositing titanium over the insulative material to within the contact opening to form a first layer comprising titanium silicide in electrical connection with the silicon comprising substrate;
   exposing the first layer to a nitrogen containing plasma effective to transform at least an outer portion of the first layer into a second layer comprising titanium nitride;
   depositing titanium over the insulative material to within the contact opening to form an elemental titanium comprising third layer over the second layer;
   exposing the third layer to a nitrogen containing plasma effective to transform at least an outer portion of the third layer into a layer comprising titanium nitride;
   depositing a metal over the insulative material to within the contact opening over the transformed third layer;
   removing any remnant first layer, second layer, third layer, transformed third layer and metal materials from over the insulative material to form an isolated conductive contact within the contact opening in electrical connection with the silicon comprising substrate; and
   further comprising, after the exposing of the third layer, exposing the transformed outer portion of the third layer to a nitrogen containing atmosphere at a pressure of at least 50 Torr prior to any subsequent deposition.

35. A method of forming a conductive line comprising:
   forming a conductively doped silicon comprising semiconductive material over a substrate;
   depositing titanium over the semiconductive material to form a first layer in electrical connection with the semiconductive material;
   exposing the first layer to a nitrogen containing plasma effective to transform at least an outer portion of the first layer into a second layer comprising titanium nitride;
   depositing titanium to form an elemental titanium comprising third layer over the second layer;
   exposing the third layer to a nitrogen containing plasma effective to transform at least an outer portion of the third layer into a layer comprising titanium nitride;
   depositing a metal over and in electrical connection with the transformed third layer; and
   forming the semiconductive first layer, second layer, third layer, transformed third layer and metal materials into a conductive line.

36. The method of claim 35 wherein the forming of the semiconductive first layer, second layer, third layer, transformed third layer and metal materials into a conductive line comprises etching all of said materials using a common mask.

37. The method of claim 35 wherein said depositings are by chemical vapor deposition using an inorganic titanium containing precursor.

38. The method of claim 35 wherein the depositing to form the first layer is at a temperature effective to form titanium silicide during said first layer depositing from silicon of the semiconductive material and the titanium being deposited over the semiconductive material.

39. The method of claim 38 wherein the first layer depositing forms all of the titanium of the first layer immediately over the semiconductive material to constitute titanium silicide.

40. The method of claim 38 wherein the first layer depositing forms only an inner portion of the titanium of the first layer immediately over the semiconductive material to constitute titanium silicide.

41. The method of claim 35 wherein the depositings occur in the same chamber.

42. The method of claim 35 wherein the exposings occur in the same chamber.

43. The method of claim 35 wherein the depositings and the exposings occur in the same chamber.

44. The method of claim 35 wherein the depositings and the exposings occur in the same chamber with the substrate not being removed therefrom from start of the first layer depositing until after the exposing to transform at least the outer portion of the third layer.

45. The method of claim 35 further comprising, after the exposing of the third layer, exposing the transformed outer portion of the third layer to a nitrogen containing atmosphere at a pressure of at least 50 Torr prior to any subsequent deposition.

46. A method of forming a conductive line comprising:
forming a conductively doped semiconductive material over a substrate;
forming a first titanium comprising layer over and in electrical connection with the semiconductive material;
exposing the first layer to a nitrogen containing plasma effective to transform at least an outer portion of the first layer into a second layer comprising titanium nitride;
depositing titanium to form an elemental titanium comprising third layer over the second layer;
exposing the third layer to a nitrogen containing plasma effective to transform at least an outer portion of the third layer into a layer comprising titanium nitride;
depositing a metal over and in electrical connection with the transformed third layer;
forming the semiconductive first layer, second layer, third layer, transformed third layer and metal materials into a conductive line; and
wherein the first titanium comprising layer is formed by chemical vapor deposition of titanium silicide.

47. The method of claim 46 further comprising, after the exposing of the third layer, exposing the transformed outer portion of the third layer to a nitrogen containing atmosphere at a pressure of at least 50 Torr prior to any subsequent deposition.

48. A method of forming a conductive connection on a substrate between a first region comprising silicon and a second region, comprising:
depositing titanium over the first region to form a first layer in electrical connection with the first region;
exposing the first layer to a nitrogen containing plasma effective to transform at least an outer portion of the first layer into a second layer comprising titanium nitride;
depositing titanium to form an elemental titanium comprising third layer over the second layer;
exposing the third layer to a nitrogen containing plasma effective to transform at least an outer portion of the third layer into a layer comprising titanium nitride;
forming the second region over and in electrical connection with the transformed third layer; and
further comprising, after the exposing of the third layer, exposing the transformed outer portion of the third layer to a nitrogen containing atmosphere at a pressure of at least 50 Torr prior to any subsequent deposition.

\* \* \* \* \*

UNITED STATES PATENT AND TRADEMARK OFFICE
CERTIFICATE OF CORRECTION

PATENT NO. : 6,316,353 B1
DATED : November 13, 2001
INVENTOR(S) : Adam D. Selsley It is certified that error appears in the above-identified patent and that said Letters Patent is hereby corrected as shown below:

<u>Column 4,</u>
Line 39, replace "A 4 preferred thickness" with -- A preferred thickness --

Signed and Sealed this

Twentieth Day of August, 2002

Attest:

JAMES E. ROGAN
*Attesting Officer*   *Director of the United States Patent and Trademark Office*